United States Patent
Lapicki et al.

(10) Patent No.: US 9,251,816 B2
(45) Date of Patent: Feb. 2, 2016

(54) MAGNETIC SENSOR SHIELD PINNED BY A HIGH-COERCIVITY FERROMAGNET

(71) Applicant: Seagate Technology LLC, Cupertino, CA (US)

(72) Inventors: Adam Andrzej Lapicki, Derry (GB); Kevin A. McNeill, Derry (GB); Marcus W. Ormston, Derry (GB); Sameh Sayed Ali Hassan, Londonderry (GB); Yuqing Du, Londonderry (IE)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/045,457

(22) Filed: Oct. 3, 2013

(65) Prior Publication Data

US 2015/0098155 A1  Apr. 9, 2015

(51) Int. Cl.
*G11B 5/39* (2006.01)
*G01R 33/09* (2006.01)

(52) U.S. Cl.
CPC ............ *G11B 5/3912* (2013.01); *G01R 33/093* (2013.01); *G01R 33/098* (2013.01)

(58) Field of Classification Search
CPC ..................... G11B 5/3912; G11B 2005/3996; G11B 5/3903; G11B 5/3932; G11B 5/313; G11B 5/3906; G01R 33/093; G01R 33/098
USPC ........................................ 360/319, 324–324.2
See application file for complete search history.

(56) References Cited

U.S. PATENT DOCUMENTS

| | | | |
|---|---|---|---|
| 7,006,375 B2 | 2/2006 | Covington | |
| 7,999,338 B2 | 8/2011 | Zheng et al. | |
| 8,125,746 B2 | 2/2012 | Dimitrov et al. | |
| 8,294,227 B2 | 10/2012 | Zheng et al. | |
| 8,320,075 B2 | 11/2012 | Macken et al. | |
| 8,437,106 B2 * | 5/2013 | Yanagisawa et al. | 360/319 |
| 8,451,567 B2 * | 5/2013 | Zhou et al. | 360/324.12 |
| 8,467,154 B2 | 6/2013 | Covington et al. | |
| 8,472,147 B2 * | 6/2013 | Singleton et al. | 360/319 |
| 8,482,883 B2 | 7/2013 | Dimitrov et al. | |
| 8,630,069 B1 * | 1/2014 | Okawa et al. | 360/319 |
| 8,760,820 B1 * | 6/2014 | Mckinlay et al. | 360/319 |
| 8,780,505 B1 * | 7/2014 | Xiao | 360/319 |
| 8,780,506 B1 * | 7/2014 | Maat et al. | 360/319 |
| 8,797,692 B1 * | 8/2014 | Guo et al. | 360/319 |

(Continued)

FOREIGN PATENT DOCUMENTS

JP          01149403 A  *  6/1989

OTHER PUBLICATIONS

A. J. Devasahayam, P. J. Sides and M. H. Kryder, "Magnetic, temperature, and corrosion properties of the NiFe/IrMn exchange couple," Journal of Applied Physics, Jun. 1, 1998, pp. 7216-7218, vol. 83, No. 11, American Institute of Physics.

J. F. Hu, J. S. Chen, B. C. Lim and T. J. Zhou, "L10 ordered FePt based double-layered perpendicular recording media with (002) oriented FeCo films as a soft magnetic underlayer," Science Direct, 2007, pp. 2067-2070, Elsevier B. V.

(Continued)

*Primary Examiner* — Will J Klimowicz
(74) *Attorney, Agent, or Firm* — Hall Estill Attorneys at Law (57) ABSTRACT

A magnetic sensor may generally be configured as a data reader capable of sensing data bits from an adjacent data storage medium. Various embodiments of a magnetic element may have at least a magnetic stack that contacts at least a first shield. The first shield can have at least one synthetic antiferromagnetic structure (SAFS) that is pinned by a high-coercivity ferromagnetic (HCFM) layer.

20 Claims, 5 Drawing Sheets

(56) References Cited

U.S. PATENT DOCUMENTS

| | | | |
|---|---|---|---|
| 2006/0221515 A1* | 10/2006 | Carey et al. | 360/324.12 |
| 2008/0061773 A1* | 3/2008 | Otagiri et al. | 324/210 |
| 2011/0205669 A1* | 8/2011 | Murakami et al. | 360/246.1 |
| 2012/0087045 A1* | 4/2012 | Yanagisawa et al. | 360/294 |
| 2012/0250472 A1* | 10/2012 | Yamane et al. | 369/13.01 |
| 2014/0268417 A1* | 9/2014 | Singleton et al. | 360/123.12 |
| 2014/0268428 A1* | 9/2014 | Dimitrov et al. | 360/313 |
| 2014/0293474 A1* | 10/2014 | Yamane et al. | 360/75 |

OTHER PUBLICATIONS

Hui Zhao, Zongzhi Zhang, Bin Ma and Q. Y. Jin, "Pinning effect and thermal stability study in L10 FePt-pinned spin valves," Journal of Applied Physics, 2007, 023909 pp. 1-4, 102, American Institute of Physics.

* cited by examiner

MAGNETIC SENSOR SHIELD PINNED BY A HIGH-COERCIVITY FERROMAGNET

SUMMARY

Various embodiments are generally directed to a magnetic sensor capable of reading data bits.

Assorted embodiments configure a magnetic element with at least a magnetic stack that contacts at least a first shield. The first shield can have at least one synthetic antiferromagnetic structure (SAFS) that is pinned by a high-coercivity ferromagnetic (HCFM) layer.

DETAILED DESCRIPTION

Heightened industry demand for data storage devices with increased data storage capacity and reduced form factors has minimized the physical dimensions of data storage components. The reduction in physical dimensions has stressed the magnetic operation of some constituent materials, which may consequently jeopardize the magnetic stability, accuracy, and performance of a data storage component. For example, reduced physical dimensions can correspond with increased volatility to heat and external magnetic forces in magnetic shields that define the magnetic extent of a data bit reading sensor. Hence, increasing the magnetic stability of magnetic materials in reduced form factor, high data bit areal density data storage devices is a continued industry emphasis.

Accordingly, a magnetic sensor can be configured as a data bit reader with at least a magnetic stack contacting a first shield and the first shield having at least one synthetic antiferromagnet structure (SAFS) that is pinned to a predetermined magnetic orientation by a high-coercivity ferromagnetic layer (HCFM). The ability to pin the SAFS with a high-coercivity magnetic material provides optimized chemical stability, especially in reduced form factors, that produces a more robust bias magnetization to the shield as well as increased resistance to challenges of device integration, such as varying magnetic fields, temperature, and oxidizing chemicals. That is, by using a HCFM layer in the top and/or bottom shield, the data reader may experience more precise bias magnetizations while having reduced stray magnetic field sensitivity.

Figure 1:
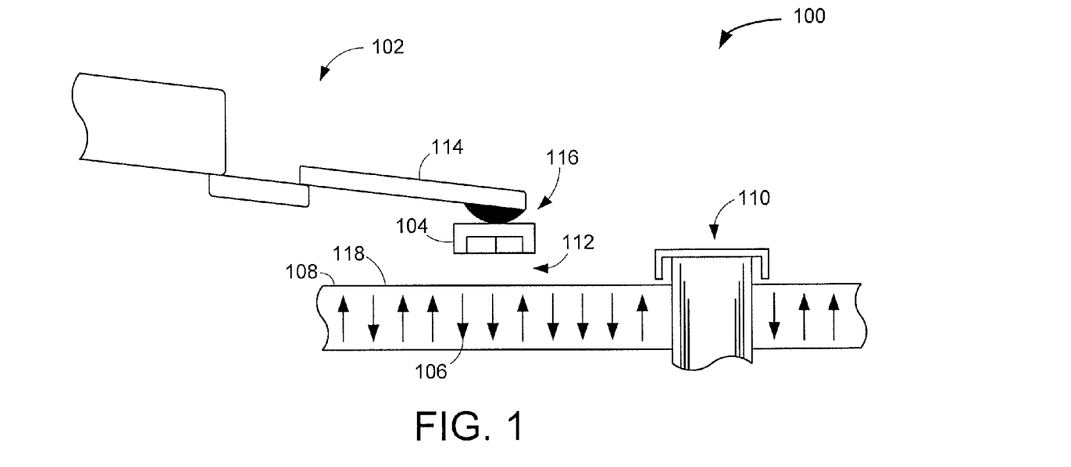
FIG. 1 provides a block representation of a portion of an example data storage device configured in accordance with various embodiments.

While a magnetic element having a HCFM pinned shield can be practiced in a variety of non-limiting environments, FIG. 1 generally displays a data transducing portion 100 of an example data storage device configured in accordance with various embodiments. The transducing portion 100 is configured with an actuating assembly 102 that positions a transducing head 104 over programmed data bits 106 present on a magnetic storage medium 108 that is attached to, and rotates about, a spindle motor 110 to produce an air bearing surface (ABS) 112. The speed in which the spindle motor 110 rotates allows a slider portion 114 of the actuating assembly 102 to fly on the ABS to position a head gimbal assembly (HGA) 116, which includes the transducing head 104, over a desired portion of the medium 108.

The transducing head 104 can include one or more transducing elements, such as a magnetic writer and magnetically responsive reader, which operate to program data to and read data from the storage media 108, respectively. In this way, controlled motion of the actuating assembly 102 and spindle motor 110 can modulate the position of the transducing head both laterally along predetermined data tracks (not shown) defined on a storage media surface 118 and vertically as measured perpendicularly to the media surface 118 to selectively write, read, and rewrite data. With the data bits 106 being more closely packed onto the data storage medium 108 to produce a greater data bit areal density, the physical dimensions of the transducing head 104 and constituent transducing means reduce to accommodate a more precise magnetic extent of individual data bits 106.

Figure 2:
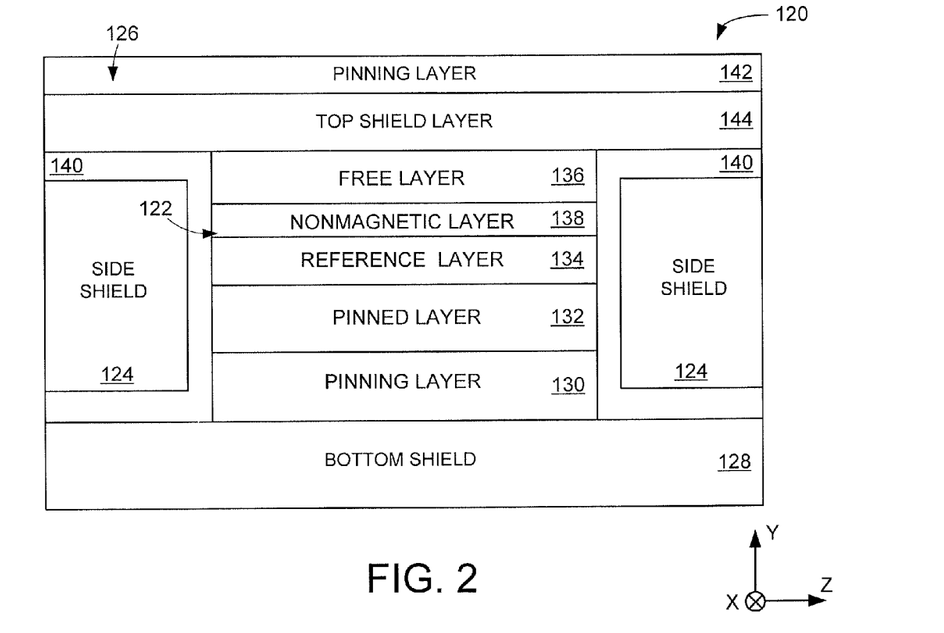
FIG. 2 shows an ABS view block representation of an example magnetic element capable of being used in the data storage device of FIG. 1.

FIG. 2 shows an ABS view block representation of an example magnetic data reader 120 capable of being used in the transducing portion 100 of the data storage device shown in FIG. 1. While not required or limited to the configuration shown in FIG. 2, the magnetic reader 120 has a magnetic stack 122 disposed laterally between magnetic side shields 124 and vertically between top 126 and bottom 128 shields on an air bearing surface (ABS). The magnetic stack 122 can be configured as a variety of different data bit sensing laminations, such as a magnetoresistive, tunnel magnetoresistive, spin valve, and a "trilayer" sensor with dual ferromagnetic free layers and without a fixed magnetization reference structure, but in the embodiment shown in FIG. 2, an abutted junction (HMRB) stack has a fixed reference structure containing pinning 130 and pinned 132 layers that sets a predetermined magnetization in a reference layer 134 while a magnetically free layer 136 is sensitive to external magnetic fields and contacts a non-magnetic spacer layer 138 opposite the reference layer 134.

While not required, various embodiments isolate the side shields 124 from the magnetic stack 122 and shields 126 and 128 with a non-magnetic insulating material 140 to balance magnetic shielding with reduced risk of magnetic shunting. However, other embodiments can couple one, or both, side shields 124 to another shield 126 and 128 to tune the magnetic shielding characteristics surrounding the magnetic stack 122. In the embodiment shown in FIG. 2, the top shield 126 is not coupled to or biased by a side shield 124, but instead by a pinning layer 142 that contacts and biases a shield layer 144 to a predetermined magnetization strength and direction that optimizes shield 126 stability and magnetic reader 120 performance.

When an antiferromagnetic (AFM) material, such as an IrMn alloy or ternary alloy where IrMn is supplemented by an additional element, is used for the pinning layer 142, the intrinsic association of the exchange bias direction with the magneto-crystalline anisotropy of the AFM material is defined by the direction of a magnetic field used during elevated temperature annealing. The use of an AFM material allows moderate magnetic field and annealing temperature values to set the magnetization strength and direction in the pinning layer 142. However, secondary conditions where magnetic fields and elevated temperatures are present, such as during implementation of the magnetic reader 120 into a data storage device, can inadvertently modify the magnetization of the pinning layer 142 and degrade magnetic reader 120 performance.

Additionally, some AFM materials can be susceptible to chemical volatility. For instance, corrosive oxidation can occur in the AFM material, particularly at the ABS where exposure to moving air is more prevalent. Such corrosive oxidation can degrade the magnetic characteristics and performance of the pinning layer 142, which can consequently decrease the magnetic biasing performance and increase magnetic volatility of the top shield 126. Accordingly, FIGS. 3-7 display ABS view block representations of portions of various example magnetic data readers constructed and operated in accordance with assorted embodiments.

Figure 3:
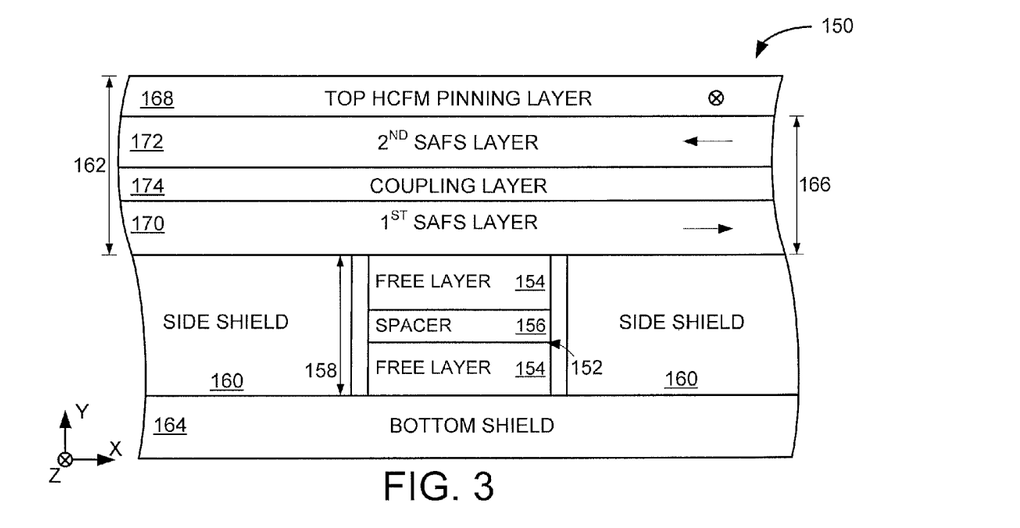
FIG. 3 illustrates an ABS view block representation of a portion of an example magnetic element constructed and operated in accordance with some embodiments.

In FIG. 3, the example magnetic data reader 150 is displayed. The magnetic data reader 150 may be constructed with an unlimited variety of shield configurations, but in some embodiments the magnetic stack 152 is a trilayer lamination comprising multiple magnetically free layers 154 separated by a non-magnetic spacer layer 156. The trilayer configuration of the magnetic stack 152 allows fixed magnetization means, such as the pinned 132 and pinning 130 layers of FIG. 2, to be removed and shield-to-shield spacing 158 to be decreased as stack biasing means are positioned distal to the ABS, such as in the form of a rear biasing magnet.

The magnetic stack 152 is disposed laterally between side shields 160 and vertically between top 162 and bottom 164 shields. The magnetic reader stack 152 can be configured in any variety of trapezoidal, square, curvilinear, and shaped structures, but is shown in FIGS. 3-7 substantially as a rectangular shape. The side shields 160 positioned on opposite sides of the magnetic reader stack 152 can be tuned to individually unique or common materials, number of layers, and shape to decrease magnetic asymmetry in the reader stack 152 and reduce sensitivity to stray magnetic fields.

In the non-limiting embodiment of FIG. 3, the top shield 162 is configured as a lamination of a SAFS 166 and a top HCFM pinning layer 168 that sets the first SAFS layer 170 and second SAFS layer 172 to a predetermined magnetization strength and direction relative to the ABS. Direct contact between the top HCFM pinning layer 168 and second SAFS layer 172 allows exchange coupling to bias the second SAFS layer 172 and antiferromagnetic coupling to bias the first SAFS layer 170 via the non-magnetic coupling layer 174. Configuring the top HCFM pinning layer 168 of a ferromagnetic alloy of Pt or Pd can further allow the magnetization of the pinning layer 168 and the top shield 162 to be reset in any direction without annealing, which provides tuning options that can accommodate a variety of different data storage environments.

Construction of the top HCFM pinning layer 168 of a high-coercivity, permanent magnet, material with a coercivity of at least 2000 Oe can allow for precise magnetization tuning in the top shield 162 to optimize magnetic stability while providing increased resistance to corrosive oxidation.

As a non-limiting example, the top HCFM pinning layer 168 can be set to a predetermined first magnetization direction, such a orthogonal to the easy anisotropy axis of the SAFS 166 along the Z axis, while the SAFS layers 170 and 172 exhibit a predetermined second magnetization direction, such as along the easy anisotropy axis, parallel to the ABS, and along the X axis. Such orthogonal magnetization directions in the top shield 162 enhances magnetic stability and performance of the top shield 162, which allows the magnetic stack 152 layers to have a reduced thickness and the magnetic reader 120 to have a reduced shield-to-shield spacing 158.

Figure 4:
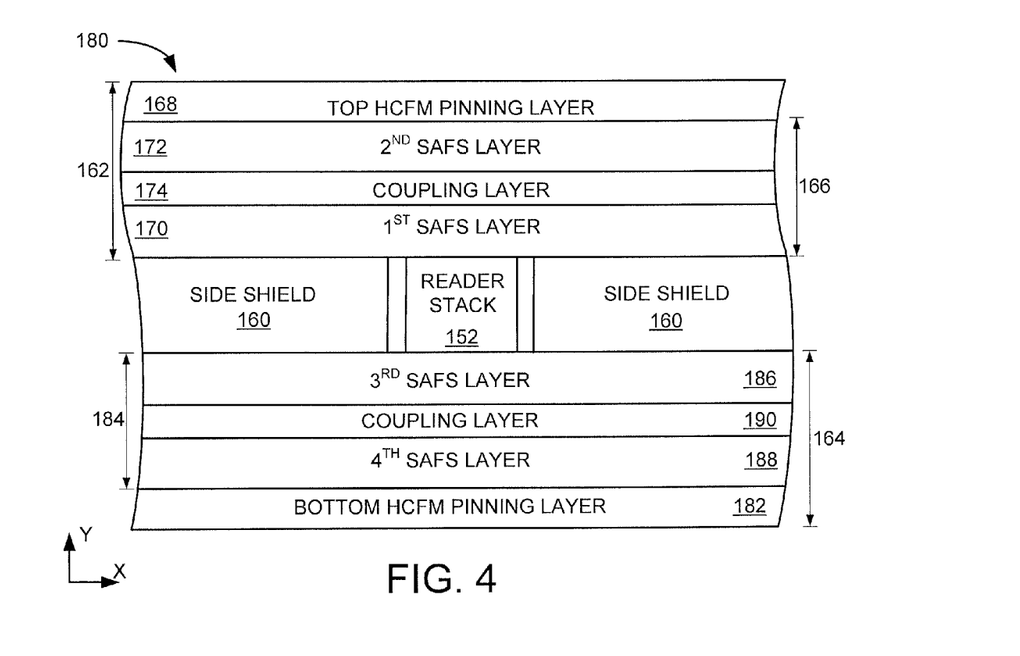
FIG. 4 is an ABS view block representation of an example magnetic element configured in accordance with assorted embodiments.

While the tuned magnetization directions and increased resistance to corrosive oxidation can be exclusively utilized in the top shield 162, as displayed in FIG. 3, assorted embodiments configure the top 162 and bottom 162 shields as laminations with tuned magnetizations, as illustrated in FIG. 4. In the example magnetic element 180 embodiment of FIG. 4, the bottom shield 164 has a bottom HCFM pinning layer 182 that biases a bottom SAFS 184 disposed between the magnetic stack 152 and the pinning layer 182.

It is contemplated that the bottom HCFM pinning layer 182 can be configured in any manner known by one of ordinary skill in art to have a similar or dissimilar structure and magnetic configuration compared to the top HCFM pinning layer 168. Regardless of the material and magnetic construction of the bottom HCFM pinning layer 182, a predetermined bias magnetization can be imparted on the third 186 and fourth 188 ferromagnetic SAFS layers through direct contact exchange coupling and antiferromagnetic coupling via the non-magnetic coupling layer 190. The ability to tune the top 162 and bottom 164 shields to similar or dissimilar structural and magnetically operational characteristics allows the magnetic element 180 to have symmetrical or asymmetrical shielding for the reader stack 152 about the Y axis, which can correspond to the downtrack and uptrack directions with respect to a data track of a corresponding data storage medium.

Figure 5:
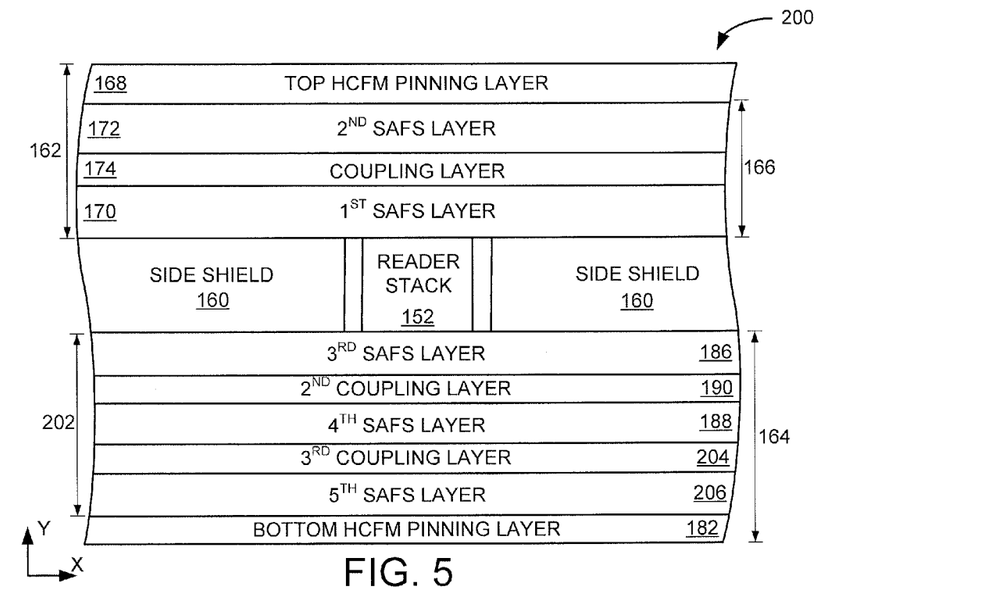
FIG. 5 displays an ABS view block representation of another example magnetic element constructed and operated in accordance with various embodiments.

While the shielding characteristics of the top 164 and bottom 164 shields can be tuned by adjusting the material, thickness along the Y axis, and magnetization directions, the shields may further be tuned to optimize reader stack 152 performance. FIG. 5 illustrates an ABS view block representation of an example magnetic data reader element 200 that has a bottom shield 164 tuned to have a SAFS 202 comprising multiple non-magnetic coupling layers 190 and 204 that separate the ferromagnetic SAFS layers 186, 188, and 206. By tuning the various constituent layers of the SAFS 202 to be similar or dissimilar materials and thicknesses in association with the material and thickness of the bottom HCFM pinning layer 182, magnetic shielding can be controlled to correspond to optimized data reader stack 152 performance, such as pulse width (PW50) at 50% of the peak amplitude.

The addition of the third coupling layer 204 and fifth SAFS layer 206 to the magnetic data reader element 200 can separate the permanent magnetization of the bottom HCFM pinning layer 182 from the reader stack 152 while providing multiple antiferromagnetic coupling means in the SAFS 202. Through the tuned material and thickness selection of the constituent layers of the SAFS 202, the high magnetic coercivity of the bottom HCFM pinning layer 182 can be translated into shielding means for the reader element 200 and biasing means for the reader stack 152 in the event the bottom shield 164 is magnetically coupled to the reader stack 152.

Figure 6:
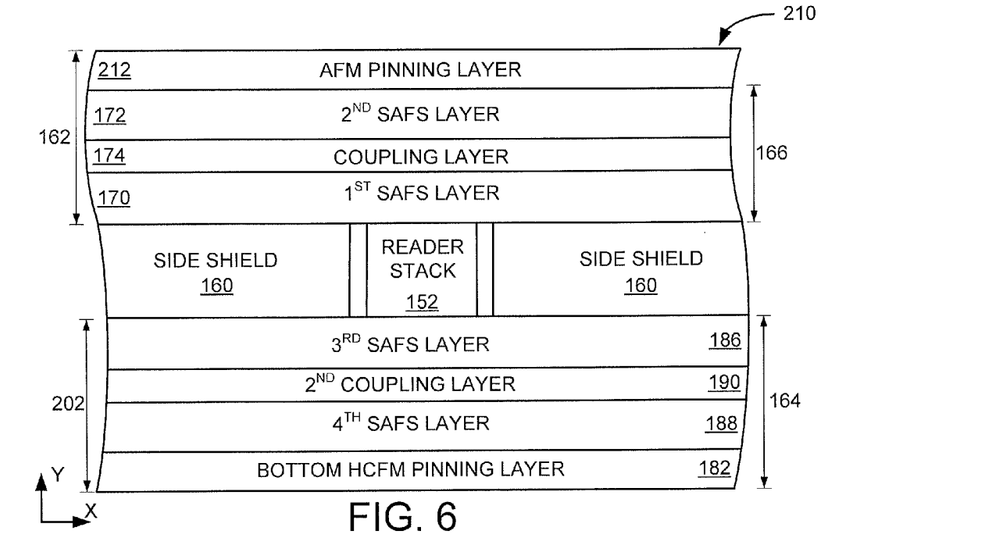
FIG. 6 is an ABS view block representation of a portion of an example magnetic element configured in accordance with some embodiments.

Even though the use of HCFM in the top 162 and bottom 164 shields can provide more robust resistance to magnetic fields, temperature, and oxidizing chemicals compared to AFM pinning materials, reduction in the physical dimensions of the magnetic data reader element 200 can position the potentially strong magnetizations of the HCFM close to the reader stack 152 and jeopardize reader stack accuracy. Accordingly, FIG. 6 shows an example magnetic data reader element 210 configured with an AFM pinning layer 212 in the top shield 164, opposite the HCFM pinning layer 182 of the bottom shield 164. The ability to have both a HCFM 182 and AFM 212 pinning layers provides tuning flexibility that can allow predetermined magnetization directions and strengths in all constituent layers of the top 162 and bottom 164 shields.

Figure 7:
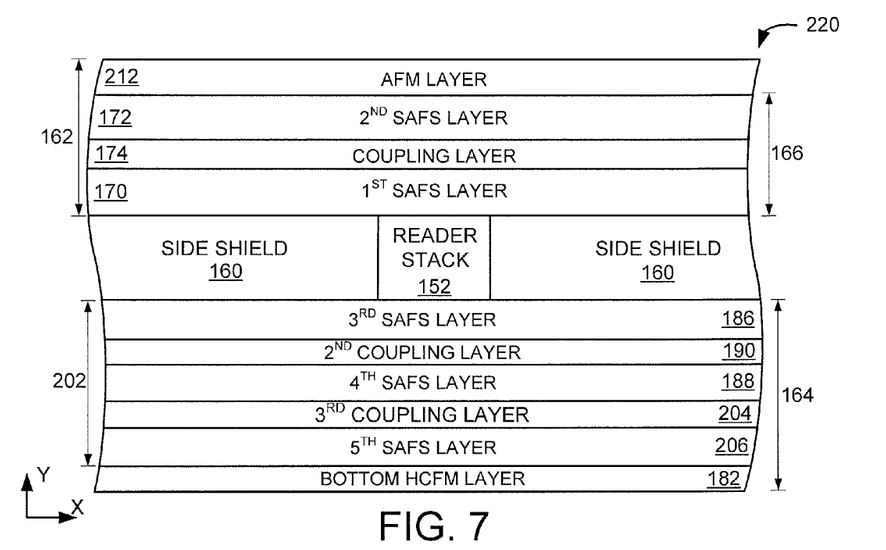
FIG. 7 illustrates an ABS view block representation of another example magnetic element constructed and operated in accordance with assorted embodiments.

FIG. 7 displays yet another embodiment of a magnetic data reader element 220 in which the bottom shield 164 comprises multiple non-magnetic coupling layers 190 and 204 and anti-ferromagnetic coupling means while the top shield 162 comprises an AFM pinning layer 212. The combination of the additional SAFS layers 204 and 206 to the AFM pinning layer 212, in comparison with element 210 of FIG. 6, illustrates the diversity of tuning options available to provide optimized shielding and performance to the reader stack 152. For example, the AFM pinning layer 212 can be configured with a magnetization direction that is parallel to the ABS, X axis, and magnetization direction of the top shield SAFS layers 170 and 172 while the bottom HCFM pinning layer 182 has an orthogonal magnetization direction compared to the constituent layers of the SAFS 202. Such asymmetrical shielding along the Y axis can provide a balance of shield magnetization strengths that optimize shielding with respect to magnetic responsiveness of the reader stack 152.

It should be noted that the SAFS layers 170, 172, 186, 188 and 206 can be any type of SAFS layer known to one of ordinary skill in the art. The HCFM layers 168 and 182 can be constructed of any material with satisfactory chemical and physical stability to magnetically bias the SAFS layers 170, 172, 186, 188, and 206. In another embodiment of the present disclosure, the constituent layers of the magnetic stack 152 are tuned to minimize the size and thickness. In another embodiment, capping layers (not shown) can be disposed outside of and adjacent to the top HCFM pinning layer 168, the bottom HCFM layer 182, and/or the AFM pinning layer 212. The capping layers can be manipulated similarly to the top HCFM pinning layer 168, the bottom HCFM pinning layer 182, and the AFM pinning layer 212 to assist in the tuning of the magnetic stack 122.

It is contemplated that the magnetizations of the top 162 and bottom 164 shields can be tuned in a diverse variety of manners. However, assorted embodiments tune the shield magnetizations by carrying out the example magnetic element magnetization scheme 230 of FIG. 8. The scheme 230 begins by forming a SAFS of a predetermined number of magnetic and non-magnetic layers before annealing the layers individually or collectively along a first axis in step 232. As a non-limiting example, a SAFS was annealed at 225° C. for 2 hours with a 2000 Oe magnetic saturation along the easy anisotropy axis of the respective layers, which coincides with the X axis and ABS.

Figure 8:
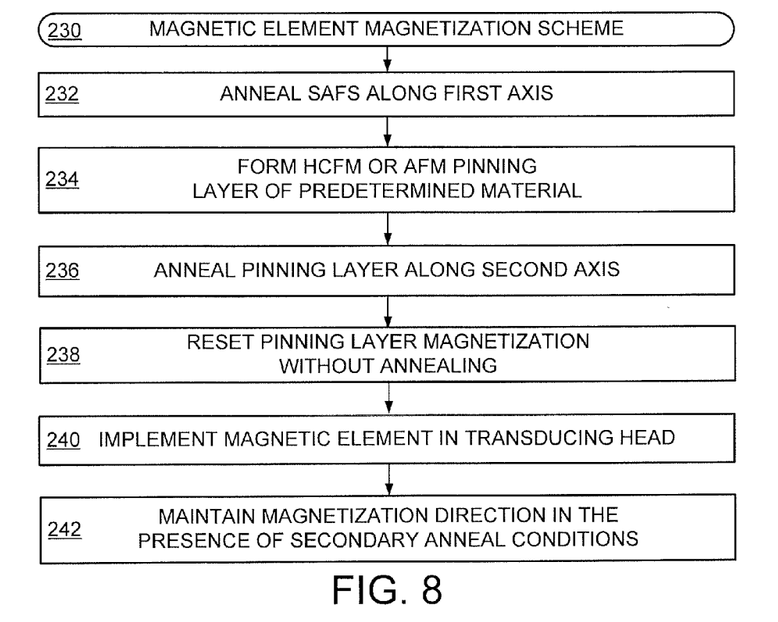
FIG. 8 maps an example magnetic element magnetization scheme carried out in accordance with various embodiments.

Next, step 234 forms a pinning layer atop the constructed SAFS with a predetermined material, such as a HCFM material or an AFM material. The formation of the pinning layer proceeds to step 236 where the pinning layer is annealed along a second axis that is orthogonal to the first axis. For instance, the pinning layer can be subjected to a magnetic saturation of 2 T along the Y axis, perpendicular to the ABS. It is noted that the annealing of step 236 does not involve an elevated temperature, although it may in some embodiments, which may alter the magnetizations of the SAFS layers. In the event an AFM material is used for the pinning layer, the annealing conditions of step 236 are adjusted to accommodate the increased sensitivity of the AFM material to magnetic saturation and heat.

Subsequently, step 238 resets the magnetization of the pinning layer without annealing. The ability to reset the pinning layer magnetization without annealing allows the magnetization of the underlying SAFS to remain along the first axis, as opposed to if the pinning layer was annealed and the SAFS' magnetization would be altered. Resetting the pinning layer magnetization in step 238 proceeds to step 240 where the magnetic element is implemented into a transducing head as part of a data storage device incorporation plan. That is, step 240 can integrate the magnetic element from step 236 into a data storage device, which may involve at least the implementation of the magnetic element into a transducing head, the head assembled into a suspension, the suspension assembled into an actuating system, and the actuating system incorporated with a one or more data storage media.

The implementation of step 240 can then be followed by step 242 where the magnetization direction of the SAFS and pinning layer are maintained despite the presence of secondary annealing conditions, such as elevated temperatures and field-assisted annealing. Through the various steps of scheme 230, the magnetization direction of at least one shield of a magnetic element can be tuned. However, the scheme is not limited to the steps of FIG. 8 as the assorted aspects can be conducted individually and sequentially on multiple shields with similar and dissimilar magnetization directions and annealing conditions.

Figure 9:
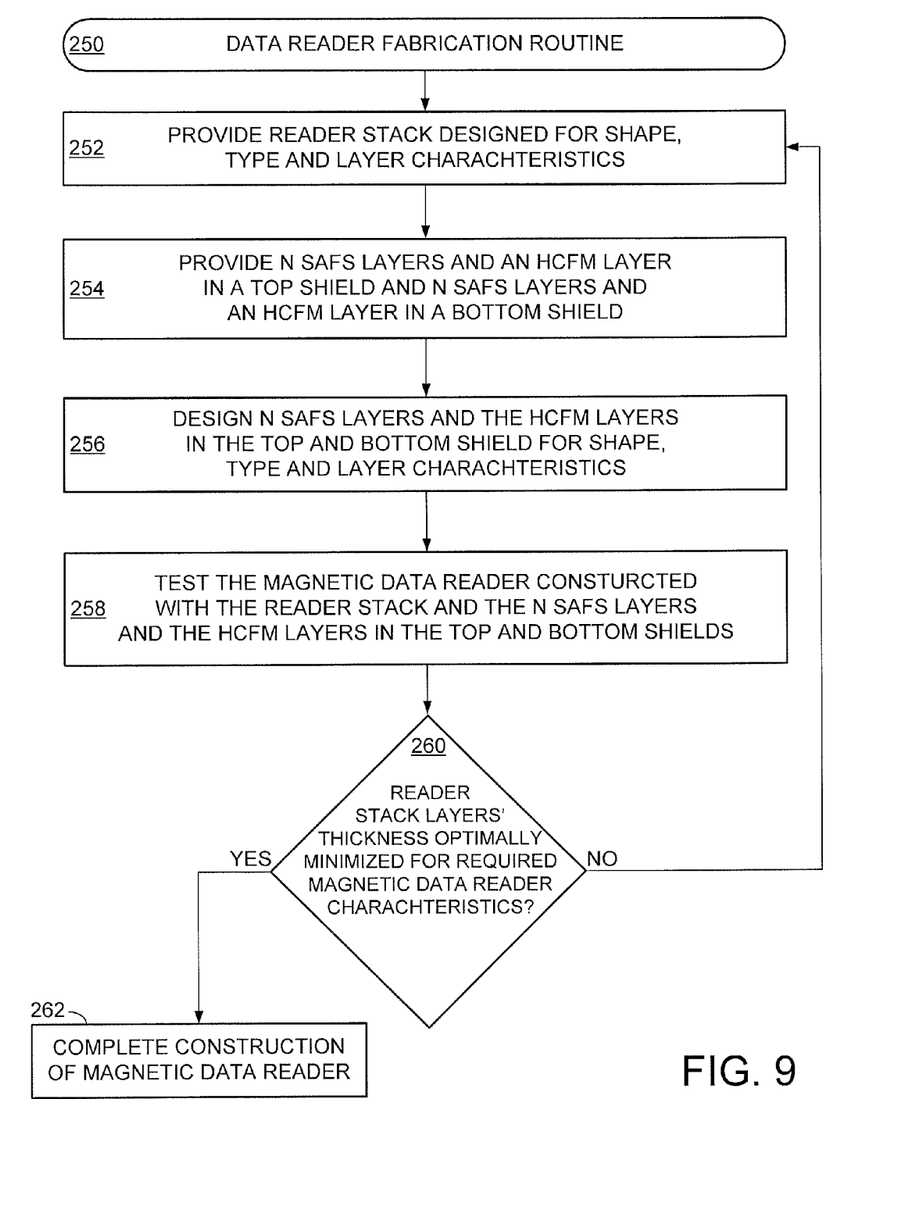
FIG. 9 is a flowchart illustrating steps of an exemplary magnetic element fabrication routine conducted in accordance with some embodiments.

Furthermore, scheme 230 may be conducted in concert with other magnetic element fabrication steps, such as the example data reader fabrication routine 250 shown in FIG. 9. In accordance with various embodiments, routine 250 can be carried out initially by providing a reader stack that has been designed for shape, type and layer characteristics responsive to top and bottom shield configurations in step 202. Step 254 can then provide N SAFS layers and an HCFM layer in a top shield and N SAFS layers and an HCFM layer in a bottom shield. The N SAFS layers and the HCFM layer in the top shield and the N SAFS layers and the HCFM layer in the bottom shield can be designed for shape, type and layer characteristics in step 256.

The reader stack is disposed between the N SAFS layers and the HCFM layer in the top shield and the N SAFS layers and the HCFM layer in the bottom shield is disposed about the reader stack in step 258. The bottom shield and top shield may include additional SAFS layers, as shown in FIGS. 3-7. Step 258 tests the magnetic data reader to determine whether desirable characteristics are possessed by the magnetic data reader. Next, decision 260 evaluates if the reader stack has been optimized at least for thickness and performance per predetermined design specifications.

If decision 260 renders a lack of reader stack optimization, step 252 is revisited with an emphasis on meeting the predetermined design specifications, such as minimized shield-to-shield spacing. When decision 260 determines the reader stack complies with the design specifications, step 262 completes construction of the magnetic data reader with one or more processing steps, which can be any number and type of processes like polishing, lapping, and assembly into a data storage component.

With the diverse tuning options available by configuring one or more magnetic shields of a magnetic data reading element with a HCFM layer that pins a SAFS, structural and operational performance of the data reading element can be optimized. The increased chemical stability of the HCFM compared to an AFM can translate into increased shield stability by allowing orthogonal magnetization directions to be present in the shield and less susceptible to secondary annealing conditions that may occur during data storage device construction and data storage operations. Moreover, the chemical stability of the HCFM can provide enhanced robustness to corrosive oxidation that can degrade shield stability and data reading performance over time.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. An apparatus comprising a magnetic stack disposed between and contacting first and second shields, the first shield having at least one synthetic antiferromagnetic structure (SAFS) pinned by a high-coercivity ferromagnetic (HCFM) layer having a coercivity of at least 2000 Oe, the SAFS having first and second ferromagnetic layers each set with a first magnetization direction parallel to an easy axis of anisotropy by an annealing operation involving an application of heat and magnetization, the HCFM layer having a second magnetization direction oriented perpendicular to the first magnetization by a resetting operation involving an application of magnetization without heat, the second shield configured to provide asymmetrical shielding for the magnetic stack along a downtrack direction.

2. The apparatus of claim 1, wherein the magnetic stack comprises fixed and free magnetizations that form an abutted junction.

3. The apparatus of claim 1, wherein the magnetic stack comprises multiple free magnetizations without a fixed magnetization that form a trilayer sensor.

4. The apparatus of claim 1, wherein the HCFM layer is separated from the magnetic stack by a shield layer.

5. The apparatus of claim 4, wherein the shield layer comprises NiFe.

6. The apparatus of claim 1, wherein the HCFM layer comprises a ferromagnetic alloy of Pt.

7. The apparatus of claim 1, wherein the HCFM layer comprises a ferromagnetic alloy of Pd.

8. The apparatus of claim 1, wherein the magnetic stack is disposed between first and second side shields, the side shields separated from the magnetic stack by a non-magnetic material.

9. The apparatus of claim 8, wherein each side shield is separated from the first shield by the non-magnetic material.

10. The apparatus of claim 8, wherein the HCFM layer is exchanged coupled to the at least one SAFS.

11. A magnetic element comprising a magnetic stack disposed between and contacting first and second shields, the first shield having at least one synthetic antiferromagnetic structure (SAFS) pinned by a first high-coercivity ferromagnetic (HCFM) layer having a coercivity of at least 2000 Oe and constructed of an alloy of Pd, the SAFS having first and second ferromagnetic layers each set with a first magnetization direction parallel to an easy axis of anisotropy by an annealing operation involving an application of heat and magnetization the HCFM layer having a second magnetization direction oriented perpendicular to the first magnetization by a resetting operation involving an application of magnetization without heat, the second shield configured to provide asymmetrical shielding for the magnetic stack along a downtrack direction.

12. The magnetic element of claim 11, wherein the first shield comprises the first HCFM layer and the second shield comprises a second HCFM layer.

13. The magnetic element of claim 12, wherein the first and second HCFM layers are different materials.

14. The magnetic element of claim 12, wherein the second shield comprises two SAFS each pinned by the second HCFM layer.

15. The magnetic element of claim 12, wherein the second shield comprises three SAFS each pinned by the second HCFM layer.

16. The magnetic element of claim 11, wherein the second shield comprises a SAFS pinned by an antiferromagnetic (AFM) layer.

17. The magnetic element of claim 11, wherein the second magnetization direction is orthogonal to an air bearing surface of the magnetic stack.

18. An apparatus comprising a magnetic stack disposed between and contacting first and second shields, the first shield having at least one synthetic antiferromagnetic structure (SAFS) pinned by a high-coercivity ferromagnetic (HCFM) layer having a coercivity of at least 2000 Oe, the SAFS having first and second ferromagnetic layers each set with a first magnetization direction parallel to an easy axis of anisotropy by an annealing operation involving an application of heat and magnetization, the HCFM layer having a second magnetization direction oriented perpendicular to the first magnetization by a resetting operation involving an application of magnetization without heat, the second shield having at least one SAFS pinned by an antiferromagnetic (AFM) layer to provide asymmetrical shielding for the magnetic stack along a downtrack direction.

19. The apparatus of claim 18, wherein the at least one SAFS of the second shield having the first magnetization direction parallel to the easy axis of anisotropy.

20. The apparatus of claim 18, wherein the HCFM and AFM layers each are positioned on an air bearing surface with the magnetic stack.

* * * * *